US006181363B1

(12) United States Patent
Satoh

(10) Patent No.: US 6,181,363 B1
(45) Date of Patent: Jan. 30, 2001

(54) LIGHT-SOURCE DEVICE OF A MULTI-BEAM SCANNING APPARATUS

(75) Inventor: Nobuyuki Satoh, Yokohama (JP)

(73) Assignee: Ricoh Company, Ltd., Tokyo (JP)

( * ) Notice: Under 35 U.S.C. 154(b), the term of this patent shall be extended for 0 days.

(21) Appl. No.: 09/277,748

(22) Filed: Mar. 29, 1999

(30) Foreign Application Priority Data

Mar. 27, 1998 (JP) .................................................. 10-081117

(51) Int. Cl.[7] ....................................................... G02B 7/02
(52) U.S. Cl. ......................... 347/238; 347/242; 359/204; 372/24; 372/101; 372/102; 372/103; 156/275.7; 156/293
(58) Field of Search ............................. 359/204; 347/238, 347/241, 242, 245; 372/24, 101, 102, 103; 156/60, 64, 275.5, 275.7, 293, 294

(56) References Cited

U.S. PATENT DOCUMENTS 5,805,199 * 9/1998 Aoki ...................................... 359/204
5,999,345 * 12/1999 Nakajima et al. ..................... 359/204

* cited by examiner

Primary Examiner—Michael W. Ball
Assistant Examiner—Michael A Tolin
(74) Attorney, Agent, or Firm—Oblon, Spivak, McClelland, Maier & Neustadt, P.C.

(57) ABSTRACT

A light-source device of a multi-beam scanning apparatus including a plurality of semiconductor lasers, collimator lenses provided for the semiconductor lasers and a holder member integrally holding the semiconductor lasers and the collimator lenses. The semiconductor lasers are pressed into the holder member, and the collimator lenses are bonded to the holder member with a part of each edge portion of the collimator lenses adjusted in position relative to said holder member. Positions of press-in portions of the holder member for the semiconductor lasers are relatively deviated and formed in such a manner that adhesive layers for bonding the holder member and the collimator lenses have a same thickness.

10 Claims, 5 Drawing Sheets

LIGHT-SOURCE DEVICE OF A MULTI-BEAM SCANNING APPARATUS

BACKGROUND OF THE INVENTION

1. Field of the Invention

The present invention relates to a light-source device of a multi-beam scanning apparatus.

2. Discussion of the Background

It is well known that in an image forming device, such as a printer or a digital copying machine, a scanning apparatus scans a photosensitive surface with light beams of a semiconductor laser for forming an image thereupon.

As an example of the above scanning apparatus, there is known a multi-beam scanning apparatus in which a plurality of light emitting devices are used. In the multi-beam scanning apparatus, a plurality of beams emitted by the plurality of light emitting devices are guided to a scanned surface via a common optical system, and converged in a sub-scanning direction as a plurality of mutually separated spots. The plurality of beams are simultaneously deflected by a deflector included in the optical system, and the scanned surface is scanned by the plurality of beams formed as the spots.

FIG. 4A illustrates an example of a multi-beam scanning apparatus, in which two beams are simultaneously radiated from a light-source device 10. These two beams form a parallel light flux, and are converged in a sub-scanning corresponding direction by a cylindrical lens 12 to form longitudinal linear images in a main scanning corresponding direction in the vicinity of a deflecting/reflecting surface of a rotating polygonal mirror 14 as a deflector. The sub-scanning directions is a direction corresponding to a sub-scanning direction on an optical path leading to a scanned surface from a light source, and the main scanning direction is a direction corresponding to a main scanning direction on the optical path to the scanned surface from the light source. Beams reflected in the deflecting/reflecting surface of the rotating polygonal mirror 14 are deflected at an equiangular velocity with uniform rotation of the rotating polygonal mirror 14. The beams are then incident upon fθ mirror 16 having an image forming function, reflected by the fθ mirror 16, and turned by a mirror 18. Then, the beams are transmitted through a longitudinal toroidal lens 20 having a barrel-shaped toroidal surface, and have their optical paths folded by a mirror 22. Next, the beams are converged in spots on a photosensitive surface of a photoconductor unit 24 as the scanned surface via the fθ mirror 16 and longitudinal toroidal lens 20. In this case, the fθ mirror 16 mainly converges each deflected beam in the main scanning direction. Moreover, the longitudinal toroidal lens 20 cooperates with the fθ mirror 16 to converge each beam in the sub-scanning direction.

In the light-source device 10, as illustrated in FIG. 4B, beams radiated from two semiconductor lasers 101, 102 are formed into a parallel light flux by coupling lenses 103, 104 as collimator lenses supported by a holder 60 (see FIG. 5), described later, and synthesized by a beam synthesizer 105.

The beam synthesizer 105 is provided for combining optical axes of the parallel flux from the coupling lenses 103, 104, and the beam spots are overlapped with one another on the scanned surface by arranging the semiconductor lasers 101, 102 on optical axes of the coupling lenses 103, 104.

As illustrated in FIG. 4B, the beam synthesizer 105 is integrally constructed by a ½ wavelength plate 1051 and a prism 1052. The prism 1052 includes a polarizing/separating film 1053. The polarizing/separating film 1053 transmits P polarized light, and reflects S polarized light.

The beam synthesizer 105 is supported by the holder 60 constructed as illustrated in FIG. 5, in which the holder 60 includes a plate base 61 and a shelf-like portion 62.

The plate base 61 has screw through holes b1 to b4 (b4 not shown) formed in four corners, and is fixed to a casing (not shown) via screws (not shown) passed through the screw through holes b1 to b4.

The shelf-like portion 62 includes a member formed integral with the flat plate base 61 and a overhang piece and therefore has an angled side face. The member formed integral with the base plate 61 is formed with semiconductor laser attachment holes 63, 64 leading to the plate base 61.

As shown in FIG. 5A, a portion 621 for holding the coupling lenses 103, 104 and a portion 622 for holding the beam synthesizer 105 are formed on a top surface of the overhang piece of the shelf-like portion 62, which is parallel with the optical axes of the semiconductor lasers 101, 102 pressed in the attachment holes 63, 64 (refer to FIG. 5B).

The coupling lenses 103, 104 are made integral with the shelf-like portion 62 by an adhesive applied to bonding areas 6211, 6212 of the holding portion 621. Moreover, in FIG. 5A, numeral 6221 denotes an area for bonding the beam synthesizer 105, and as illustrated in FIG. 5B, the beam synthesizer 105 is bonded and fixed in the bonding area 6221.

The holder 60 is provided with a casing (not shown) attached and fastened via the screw through holes b1 to b4. Also provided is a ¼ wavelength plate for circularly polarizing each synthesized beam and an aperture for shaping the synthesized beam which are arranged in the casing on an optical axis between the beam synthesizer 105 and the cylindrical lens 12 (FIG. 4A).

In the light-source device 10 constructed as described above, when the semiconductor lasers 101, 102 and the beam synthesizer 105 are assembled into the light-source device 10, the semiconductor lasers 101, 102 are first pressed into the attachment holes 63, 64. Then, the beam synthesizer 105 is fixed in the bonding area 6221, after its optical axis position relative to the semiconductor lasers 101, 102 is adjusted, by a photo-setting adhesive, e.g., an adhesive using a ultraviolet setting resin.

Subsequently, after a beam shaping aperture AP (FIG. 5B) is inserted and fixed into a retaining groove 623 (FIG. 5A), the coupling lenses 103, 104 are adjusted in position relative to the optical axes of the semiconductor lasers 101, 102 in such a manner that two spots formed by the beams of the semiconductor lasers 101, 102 are separated at a desired distance on the scanned surface. The coupling lenses 103, 104 are then fixed in the bonding areas 6211, 6212 by the adhesive using the ultraviolet setting resin.

The light-source device 10 is rotatable centering on the optical axes of the coupling lenses 103, 104. By rotating the light-source device 10, the separated amount of the spots on the scanned surface can be adjusted in the sub-scanning direction to change a density of the spots, i.e., a writing density, on the scanned surface. For this purpose, as shown in FIG. 4A, an angle controller 26 is provided to which a writing density switch signal is transmitted. In addition, the entire light-source device 10 can be rotated to obtain a desired writing density by operating a motor 28 in response to the signal.

In FIG. 4B, a writing signal for changing the writing density is transmitted to a semiconductor laser drive section 32 (illustrated as LD drive section in the drawing) via a writing controller 30. The semiconductor laser drive section 32 modulates and controls light of the semiconductor laser 101 in response to an odd line writing signal, and modulates and controls light of the semiconductor laser 102 in response to an even line writing signal. The construction of the light-source device 10 is described in detail in Japanese Patent Application No. 256352/1997 filed by the present applicant.

In the above light-source device 10, a center of the attachment holes 63, 64 of the semiconductor lasers 101, 102 and a center of the bonding portions of the coupling lens 103, 104 are positioned on a straight line. On the other hand, for changing the writing density on the scanned surface by separating the beams in the main scanning direction and sub-scanning direction on the scanned surface, the beams need to be deviated slightly from the optical axes of the semiconductor lasers 101, 102.

However, in the above-described light-source device 10, as illustrated in FIG. 6, center positions S1, S2 of the semiconductor lasers 101, 102 are fixed by positions of the attachment holes 63, 64. Therefore, for deviating the optical axes of the semiconductor lasers 101, 102, center positions P1, P2 of the coupling lenses 103, 104 are needed to be deviated from the centers of the bonding areas 6211, 6212.

In the above light-source device 10, the centers of the coupling lenses 103, 104 are deviated from the center of the bonding areas 6211, 6212, such that the two beam spots are separated by 2 mm in the main scanning direction, and 42.3 μm in the sub-scanning direction on the scanned surface. In this case, a deviation amount of an optical axis is set to ±4.5 mrad (FIG. 6B) in the main scanning direction, and ±0.35 mrad in the sub-scanning direction, after the beams emerge from the coupling lenses 103, 104.

Accordingly, the centers of the coupling lenses 103, 104 are deviated from the center of the bonding areas 6211, 6212 for the coupling lens 103, 104 by ±68.2 μm in the main scanning direction, and ±5.3 μm in the sub-scanning direction. In FIGS. 6A and 6B, since the deviation in the sub-scanning direction is smaller than the deviation in the main scanning direction, illustration for the deviation of the sub-scanning direction is omitted.

Accordingly, if the thickness of an adhesive layer for the bonding areas is set, for example, to 150 μm when the deviation amount of optical axis is zero, thicknesses d1, d2 of adhesive layers A1, A2 for the coupling lens 103, 104 (FIG. 6A) become as follows:

d1=150−68.2=81.8 μm d2=150+68.2=218.2 μm

In this manner, the adhesive layers A1, A2 for the coupling lenses 103, 104 are different in thickness by about 2.7 times or a width of 136.4 μm.

In the light-source device 10 constructed as above, when the coupling lenses 103, 104 are mounted to the light-source device 10, after the adhesive of ultraviolet setting resin is dropped in the bonding areas 6211, 6212 for the coupling lenses 103, 104, the coupling lenses 103, 104 are adjusted in position by monitoring collimating properties and light axis values. When the collimating properties and light axis values reach desired values, ultraviolet rays are irradiated to set the adhesive to bond the coupling lens 103, 104 in the bonding areas 6211, 6212. However, since the adhesive contracts at the time of ultraviolet radiation, the position of the coupling lenses 103, 104 are deviated from the adjusted positions and thereby the collimating properties and light axis values are deviated from the desired values.

Therefore, the desired values for the collimating properties and light axis values are adjusted to target values beforehand in consideration of the deviation amount which will be caused by contracting of the adhesive.

However, when the bonding areas 6211, 6212 for the coupling lenses 103, 104 differ in adhesive thickness, the adhesive contraction amount differs between the bonding areas 6211, 6212, causing a problem that the deviation amount (offset amount) that has been considered when the desired values for the collimating properties and light axis are adjusted changes.

Additionally, when there is a difference of 136.4 μm in thickness between the adhesive layers A1, A2 for the coupling lenses 103, 104, the thicker adhesive layer necessarily has a larger change in the contraction amount. As a result, this causes a large change in the collimating properties and light axis values of the coupling lens 103, 104 at the time of ultraviolet radiation.

Furthermore, when the adhesive layers for the coupling lens 103, 104 are different in thickness, the changes in the contraction amount of the adhesive layers due to changes of environmental temperature or other environmental conditions differ from each other. Therefore, the changes in the collimating properties and light axis value of the coupling lenses 103, 104 differ from each other between the coupling lens 103 and 104.

Particularly, when the adhesive layers have a thickness difference of about 2.7 times, as described above, the thicker adhesive layer has a larger change in the contraction amount. As a result, the change in the collimating properties and light axis value of the coupling lens bonded by the thicker adhesive layer becomes large. When the adhesive layers have the same thickness, although the light axis of each of the coupling lens 103, 104 is deviated by changes in the environmental conditions, the light axes of the coupling lens 103, 104 are deviated by the same amount, because the adhesive for each of the coupling lenses 103, 104 contracts by the same amount. Therefore, the relative position of the beams as an important multi-beam property is not deviated. On the other hand, when the adhesive layers differ in thickness, the deviation amounts of the collimating properties and light axis of the coupling 103 and 104 due to changes in the environmental conditions differ. Therefore, the relative position of the beams itself is deviated, which adversely affects the image writing density.

The adverse effect on the image writing density results in a change in the image gradation, color tone, or character sharpness according to the changes in the environmental conditions.

Moreover, when the aperture AP (FIG. 5B) is engaged into the retaining groove 623 (FIG. 5A) of the holder 60, and the ¼ wavelength plate is successively mounted on the casing (not shown) integral with the holder 60, the assembly operation takes a long time because these members are very small components and therefore are inferior in assembly properties.

SUMMARY OF THE INVENTION

Accordingly, one object of the present invention is to solve the above-described and other problems with background devices.

Another object of the present invention is to provide a light-source device of a multi-beam scanning apparatus in which, when an adhesive for bonding by ultraviolet radiation is used for fixing coupling lenses to a holder, collimating properties and light axis values of the coupling lenses can be prevented from being deviated from desired values at the time of the ultraviolet radiation or changes in environmental conditions, so that stabilized position adjustment can be performed.

Yet another object of the present invention is to provide a light-source device of a multi-beam scanning apparatus in which beam pitch changes due to changes in environmental conditions can be prevented to prevent images from being deteriorated by the changes in the environmental conditions.

Still another object of the present invention is to provide a light-source device in which assembly properties of small components, such as an aperture and a ¼ wavelength plate, are improved and the time necessary for assembly is shortened.

These and other objects are achieved by providing a light-source device of a multi-beam scanning apparatus which includes a plurality of semiconductor lasers, collimator lenses provided for the semiconductor lasers and a holder member integrally holding the semiconductor lasers and the collimator lenses. The semiconductor lasers are pressed into the holder member, and the collimator lenses are bonded to the holder member with a part of each edge portion of the collimator lenses adjusted in position relative to the holder member. Positions of press-in portions of the holder member for the semiconductor lasers are relatively deviated and formed in such a manner that adhesive layers for bonding the holder member and the collimator lenses have a same thickness.

In the light-source device, a beam synthesizing device may be integrally fixed to the holder member and an aperture for shaping each beam of the semiconductor lasers in common may be integrally bonded to the beam synthesizing device.

Further, a ¼ wavelength plate to convert a polarized state of each beam of the semiconductor lasers from linear polarization to circular polarization may be bonded to the beam synthesizing device.

BRIEF DESCRIPTION OF THE DRAWINGS

A more complete appreciation of the present invention and many of the attendant advantages thereof will be readily obtained as the same becomes better understood by reference to the following detailed description thereof when considered in conjunction with accompanying drawings, wherein.

DETAILED DESCRIPTION OF THE PREFERRED EMBODIMENTS

Figure 1A:
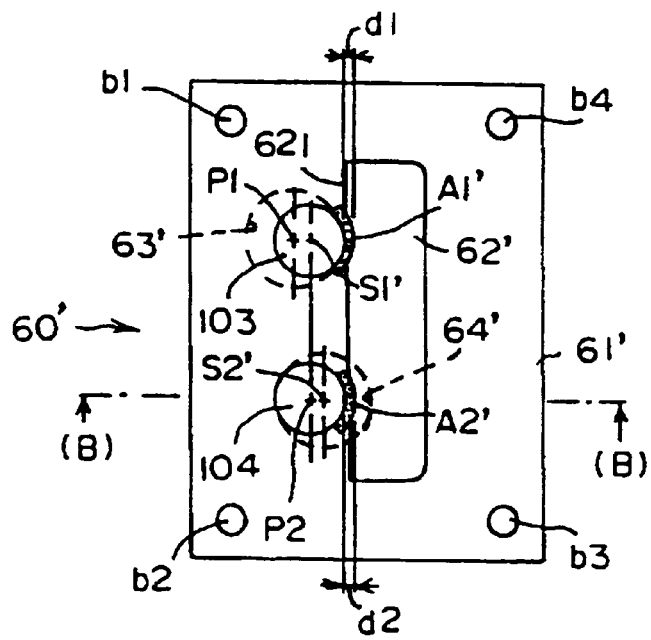
FIG. 1A is a plan view of a light-source device according to an embodiment of the present invention.
Figure 1B:
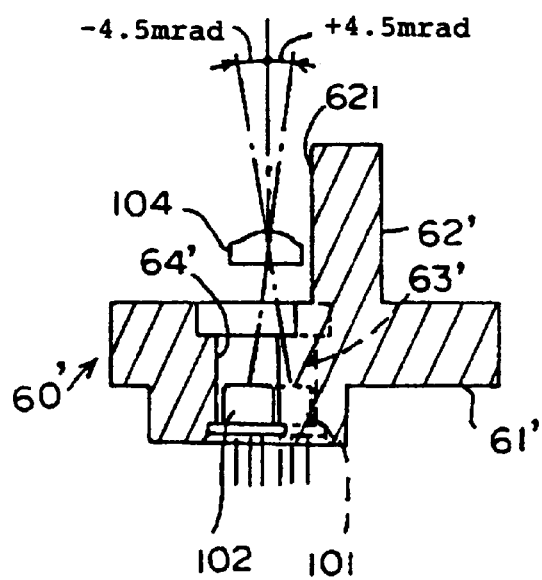
FIG. 1B is a sectional view of the light-source device as viewed in a direction shown by arrows B in FIG. 1A.
Figure 5A:
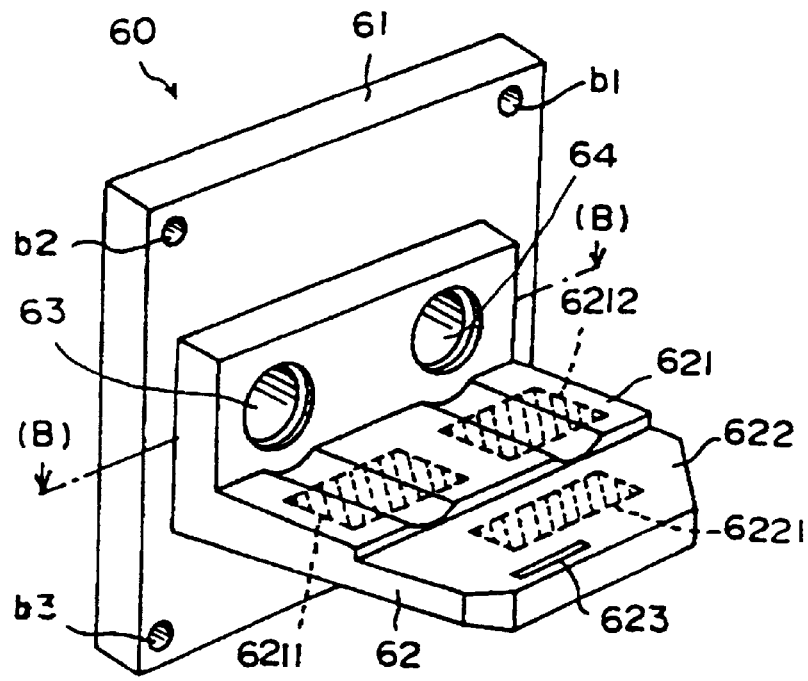
FIG. 5A is a perspective view of a holder member of a light-source device for use in the multi-beam scanning apparatus of FIG. 4.
Figure 5B:
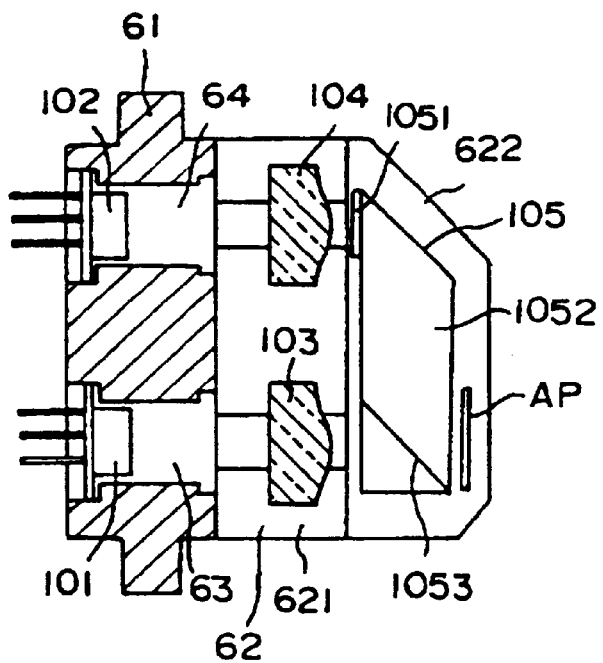
FIG. 5B is a sectional view of the holder member as viewed in a direction shown by arrows B in FIG. 5A.

An embodiment of the present invention will be described hereinafter in detail with reference to the drawings. In FIGS. 1A, 1B and subsequent drawings, the same components as those shown in FIGS. 5A, 5B and subsequent drawings are denoted with alike reference characters.

FIG. 1A is a front view of a holder (denoted by numeral 60' for convenience) in a light-source device of a multi-beam scanning apparatus according to an embodiment of the present invention. The numeral 61' corresponds to the plate base illustrated in FIGS. 5A and 5B, and the numeral 62' corresponds to the shelf-like portion illustrated in FIGS. 5A and 5B. In the embodiment, however, the shelf-like portion 62' is not provided with the aperture retaining groove 623 illustrated in FIG. 5A.

The shelf-like portion 62' is constructed by a member formed integral with the flat plate base 61' and an overhang piece extending from the member. Therefore, the shelf-like portion 62' has an angled side face. The member formed integrally with the plate base 61' is formed with semiconductor laser attachment holes 63', 64' leading to the plate base 61'.

As illustrated in FIG. 1A, in the shelf-like portion 62', a portion (denoted by the numeral 621 shown in FIGS. 5A and 5B for convenience) for holding the coupling lenses 103, 104 (FIG. 5B) is formed on a top surface of the overhang piece, which is parallel with the optical axes of the semiconductor lasers 101, 102 pressed in the attachment holes 63', 64' (FIG. 1B).

In FIGS. 1A and 1B, the attachment holes 63', 64' for the semiconductor lasers 101, 102 are constructed in such a manner that, as illustrated in FIG. 1B, light axes of the semiconductor lasers 101, 102 are deviated by ±4.5 mrad in the main scanning direction relative to the centers of the bonding areas (corresponding to the numerals 6211, 6212 in FIG. 5A) for the coupling lenses 103, 104. The light axes are similarly deviated in the sub-scanning direction, but deviation amounts are so slight that they are omitted from the drawing.

Figure 6A:
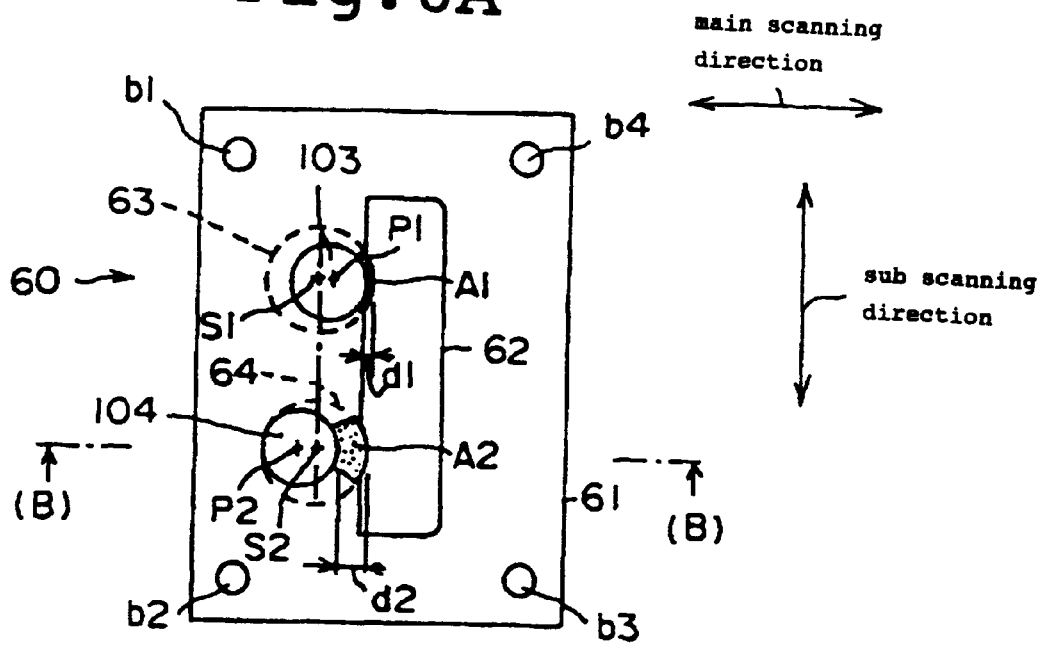
FIG. 6A is a front view illustrating a position adjustment state of collimator lenses in the holder member illustrated in FIGS. 5A and 5B.
Figure 6B:
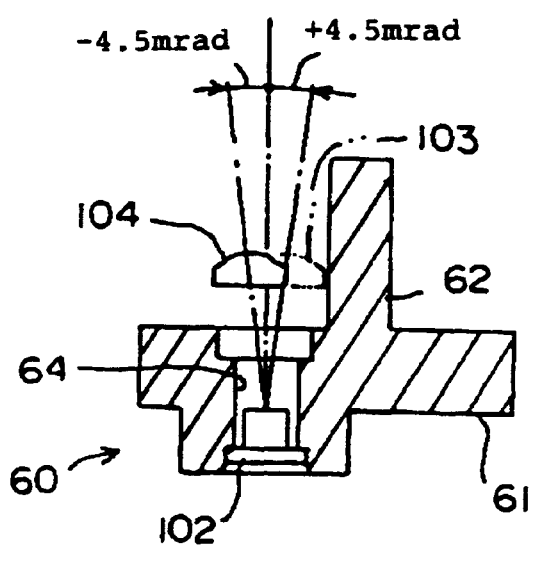
FIG. 6B is a sectional view as viewed in a direction shown by arrows B in FIG. 6A.

Specifically, in the embodiment, instead of deviating the center positions (denoted by P1, P2 in FIG. 6A) of the coupling lenses 103, 104 from the center positions in the bonding areas 6211, 6212 as illustrated in FIG. 6B, the center positions S1',S2' of the attachment holes 63, 64 for the semiconductor lasers 101, 102 are deviated from the center positions of the bonding areas 6211, 6212 beforehand.

Figure 2:
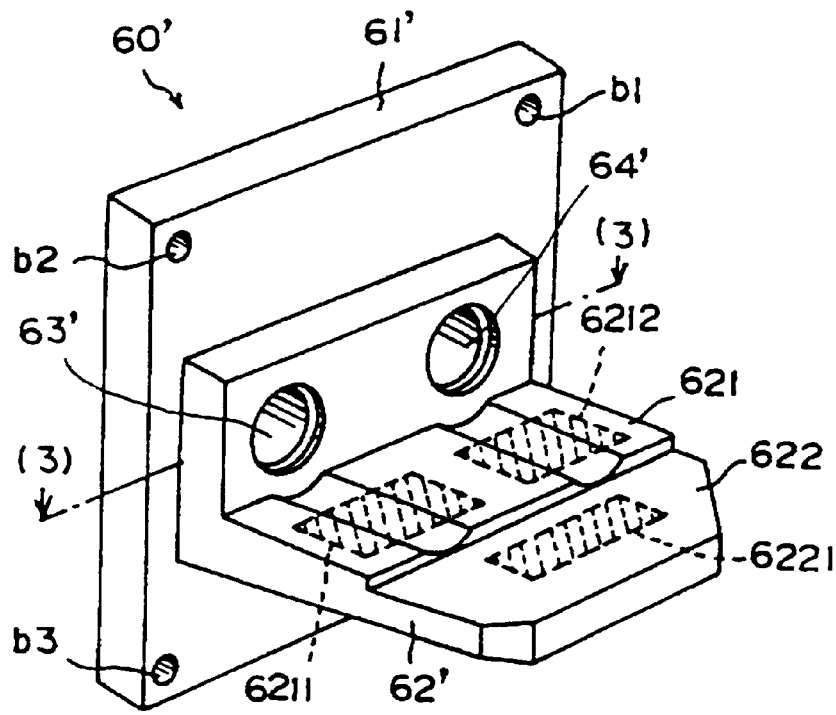
FIG. 2 is a perspective view of a holder member for use in the light-source device according to the embodiment of the present invention.

On the other hand, the shelf-like portion 62' of the holder member 60' is, as shown in FIG. 2, provided with a retaining concave portion (denoted by the numeral 622 used in FIGS. 5A and 5B for convenience) overhanging at a right angle with the member having the attachment holes 63', 64' for the semiconductor lasers 101, 102. A bonding area 6221 for fixing a beam synthesizer 105', described later, is provided on a top surface of the concave portion.

Figure 3:
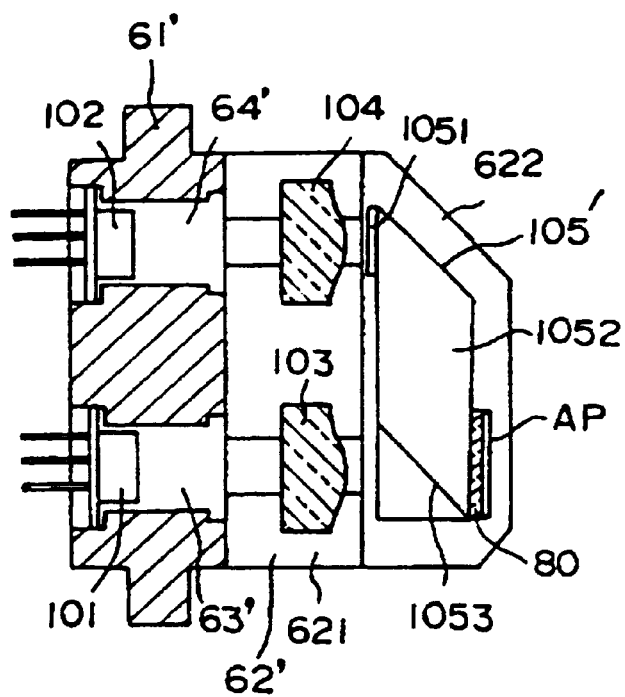
FIG. 3 is a sectional view of the holder member as viewed in a direction shown by arrows 3 in FIG. 2.
Figure 4A:
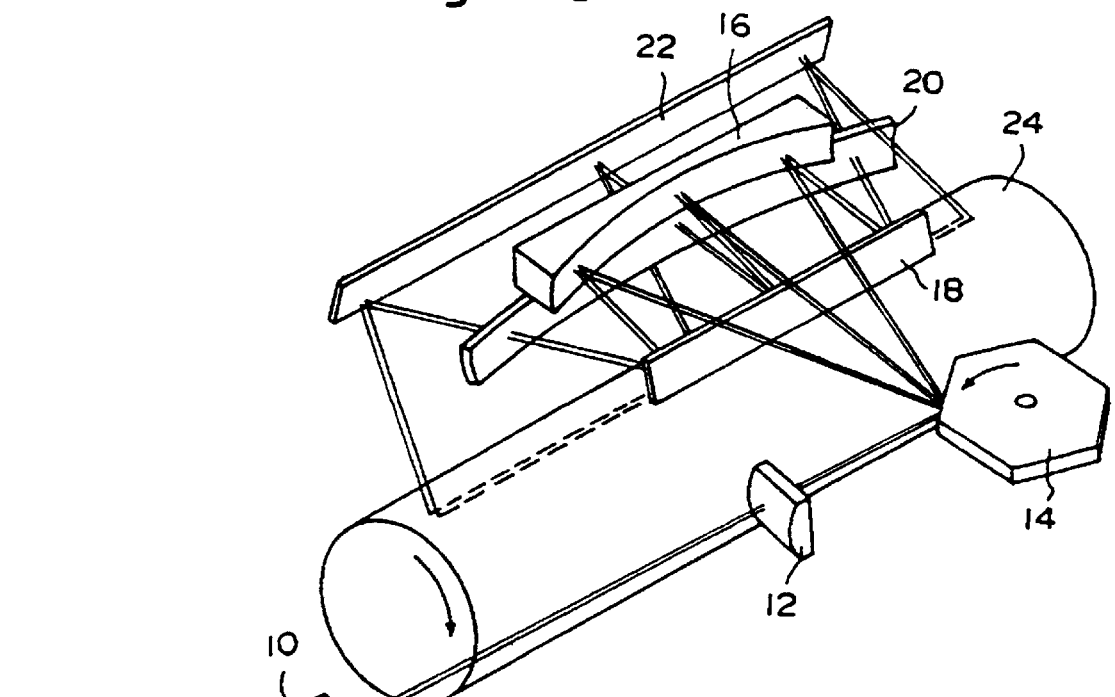
FIG. 4A is a schematic perspective view of a multi-beam scanning apparatus.
Figure 4A:
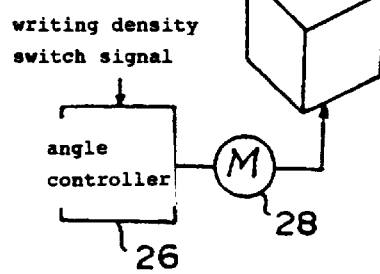
Figure 4B:
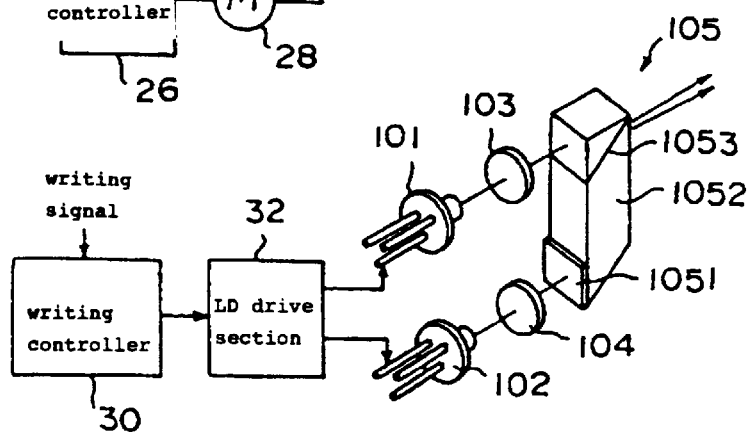
FIG. 4B is a perspective view of a beam synthesizer for use in the multi-beam scanning apparatus of FIG. 4A.

In the beam synthesizer 105', as illustrated in FIG. 3, a ¼ wavelength plate 80 is integrally bonded on a common beam emerging side of a polarized light separating film 1053 in a prism 1052. An aperture AP is bonded on an exterior surface of the ¼ wavelength plate 80.

When the light-source device 10 constructed as above is assembled, first an adhesive of ultraviolet setting resin is dropped in the bonding areas 6211, 6212 for the coupling lenses 103, 104. The bonding positions of the coupling lenses 103, 104 are then adjusted by monitoring the collimating properties and light axis values of the coupling lenses 103, 104, and the adhesive is irradiated with ultraviolet rays to set when the parameters reach desired values. Thus, the coupling lenses 103, 104 are fixed to the bonding areas 6211, 6212.

On the other hand, since the center positions of the attachment holes 63', 64' are deviated beforehand relative to the coupling lenses 103, 104 in accordance with the light axis deviation amounts, the semiconductor lasers 101, 102 are pressed while deviated from the light axes of the coupling lenses 103, 104. Since the semiconductor lasers 101, 102 are deviated beforehand in accordance with the light axis deviation amounts as above, the thickness d1, d2 of adhesive layer A1', A2' for the coupling lens 103, 104 can be set to the uniform thickness, as illustrated in FIG. 1A, such as for example, d1=d2=150 μm.

Therefore, the difference in the contraction amount, which is caused by the difference in thickness between the adhesive layers A1' and A2' at the time of ultraviolet radiation, is suppressed. Accordingly, the difference in the deviations of collimating properties or light axis values of the coupling lenses 103, 104 are also suppressed. Further, the adverse effect of changes in the environmental conditions on the beam pitch is prevented.

When the beam synthesizer 105' is bonded to the retaining portion 621 of the holder member 60, the ¼ wavelength plate 80 and the aperture AP formed beforehand integrally with the beam synthesizer 105' are bonded together. Therefore, the ¼ wavelength plate 80 and the aperture AP which have been previously assembled in a separate process can be assembled at the same time the beam synthesizer 105' is assembled.

As clearly seen from the above-mentioned embodiment, according to the present invention, since the positions of semiconductor laser attachment holes are deviated in such a manner that the adhesive layers for the coupling lenses as the collimator lenses have the same thickness, the change of contraction amount of each adhesive layer at the time of ultraviolet radiation can be uniformed. Therefore, the difference in the deviations of the collimating properties and the light axis values caused by the difference in the change of the contraction amount of the adhesive layers for the coupling lenses can be prevented. Additionally, since the lenses can be prevented from differing in the deviation amount of the collimating properties and the light axis values due to the changes in the environmental conditions, the position adjustment of the coupling lenses can correctly be performed even under the influence of changes in environmental conditions. This can prevent undesired changes in the beam pitch, lowering of image sharpness or other image deterioration from occurring.

According to the present invention, since the aperture and the ¼ wavelength plate are formed integrally with the holder member and the beam synthesizer, the aperture and the ¼ wavelength plate can be assembled with the holder member at the same time the beam synthesizer is fixed to the holder member. Therefore, the aperture and ¼ wavelength plate do not have to be separately assembled, and they can be assembled in one process. This can reduce the number of assembly processes for the light-source device of a multi-beam scanning apparatus and particularly simplify the process for assembling the small components such as the aperture and the ¼ wavelength plate.

Numerous additional modifications and variations of the present invention are possible in light of the above teachings. It is therefore to be understood that within the scope of the appended claims, the present invention may be practiced otherwise than as specifically described herein.

The present application claims priority and contains subject matter related to Japanese Patent Application No. 10-081117 filed in the Japanese Patent Office on Mar. 27, 1998, and the entire contents of which are hereby incorporated by reference.

What is claimed is:

1. A scanning apparatus, comprising:
    a light-source device having:
        a plurality of semiconductor lasers;
        collimator lenses provided for the semiconductor lasers; and
        a holder member integrally holding the semiconductor lasers and the collimator lenses,
    wherein said semiconductor lasers are pressed into said holder member, said collimator lenses are bonded to said holder member with a part of each edge portion of said collimator lenses adjusted in position relative to said holder member, and positions of press-in portions of said holder member for said semiconductor lasers are relatively deviated and formed in such a manner that adhesive layers for bonding said holder member and said collimator lenses have substantially a same thickness.

2. The scanning apparatus according to claim 1, wherein a beam synthesizing device is integrally fixed to said holder member, and an aperture for shaping each beam of the semiconductor lasers in common is integrally bonded to the beam synthesizing device.

3. The scanning apparatus according to claim 1, wherein a beam synthesizing device is integrally fixed to said holder member, and a ¼ wavelength plate to convert a polarized state of each beam of the semiconductor lasers from linear polarization to circular polarization is bonded to the beam synthesizing device.

4. The scanning apparatus according to claim 1, wherein a beam synthesizing device is integrally fixed to said holder member, and an aperture for shaping each beam of the semiconductor lasers in common, and a ¼ wavelength plate for converting a polarized state of each beam of the semiconductor lasers from linear polarization to circular polarization are bonded to the beam synthesizing device.

5. A light-source device of a multi-beam scanning apparatus, comprising:
    a plurality of semiconductor lasers;
    collimator lenses provided for the semiconductor lasers; and
    a holder member integrally holding the semiconductor lasers and the collimator lenses,
    wherein said semiconductor lasers are pressed into said holder member, said collimator lenses are bonded to said holder member with a part of each edge portion of said collimator lenses adjusted in position relative to said holder member, and positions of press-in portions of said holder member for said semiconductor lasers are relatively deviated and formed in such a manner that adhesive layers for bonding said holder member and said collimator lenses have substantially a same thickness.

6. The light-source device according to claim 5, wherein a beam synthesizing device is integrally fixed to said holder member, and an aperture for shaping each beam of the semiconductor lasers in common is integrally bonded to the beam synthesizing device.

7. The light-source device according to claim 5, wherein a beam synthesizing device is integrally fixed to said holder member, and a ¼ wavelength plate to convert a polarized state of each beam of the semiconductor lasers from linear polarization to circular polarization is bonded to the beam synthesizing device.

8. The light-source device according to claim 5, wherein a beam synthesizing device is integrally fixed to said holder member, and an aperture for shaping each beam of the semiconductor lasers in common, and a ¼ wavelength plate for converting a polarized state of each beam of the semiconductor lasers from linear polarization to circular polarization are bonded to the beam synthesizing device.

9. A method of making a light-source device of a multi-beam scanning apparatus, comprising steps of:

pressing a plurality of semiconductor lasers into a holder member with positions of the semiconductor lasers in press-in portions of the holder member deviated in such a manner that adhesive layers for bonding said holder member and collimator lenses provided for the semiconductor lasers have substantially a same thickness; and bonding the collimator lenses to said holder member with a part of each edge portion of said collimator lenses adjusted in position relative to said holder member.

10. The method of claim 9, further comprising the steps of:

bonding an aperture for shaping each beam of the semiconductor lasers to a beam synthesizing device;

bonding a ¼ wavelength plate for converting a polarized state of each beam of the semiconductor lasers from linear polarization to circular polarization to the beam synthesizing device; and fixing the beam synthesizing device to the holder member.

* * * * *

UNITED STATES PATENT AND TRADEMARK OFFICE
CERTIFICATE OF CORRECTION

PATENT NO. : 6,181,363
DATED : January 30, 2001
INVENTOR(S) : Nobuyuki SATO

It is certified that error appears in the above-identified patent and that said Letters Patent is hereby corrected as shown below:

On the title page, item (75) the inventor's name should be:

—(75) Inventor: Nobuyuki Sato, Yokohama (JP)—

Signed and Sealed this

Fifth Day of June, 2001

*Attest:*

*Attesting Officer*

NICHOLAS P. GODICI
*Acting Director of the United States Patent and Trademark Office*